United States Patent
Ni et al.

(10) Patent No.: US 10,270,062 B2
(45) Date of Patent: Apr. 23, 2019

(54) ORGANIC ELECTROLUMINESCENT DISPLAY DEVICE AND MANUFACTURING METHOD THEREOF

(71) Applicant: Shenzhen China Star Optoelectronics Technology Co., Ltd., Shenzhen, Guangdong (CN)

(72) Inventors: Kui Ni, Guangdong (CN); Yawei Liu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/532,060

(22) PCT Filed: Apr. 11, 2017

(86) PCT No.: PCT/CN2017/080097
§ 371 (c)(1),
(2) Date: May 31, 2017

(87) PCT Pub. No.: WO2018/157449
PCT Pub. Date: Sep. 7, 2018

(65) Prior Publication Data
US 2018/0287097 A1    Oct. 4, 2018

(30) Foreign Application Priority Data
Feb. 28, 2017    (CN) .......................... 2017 1 0113456

(51) Int. Cl.
H01L 51/50    (2006.01)
H01L 51/52    (2006.01)
H01L 51/56    (2006.01)

(52) U.S. Cl.
CPC ...... *H01L 51/5259* (2013.01); *H01L 51/5012* (2013.01); *H01L 51/56* (2013.01); *H01L 2251/5369* (2013.01)

(58) Field of Classification Search
CPC ...... H01L 27/30; H01L 51/0587; H01L 51/10
See application file for complete search history.

(56) References Cited

U.S. PATENT DOCUMENTS

2012/0146492 A1    6/2012   Ryu
2012/0206036 A1*   8/2012   Tanaka ................ H01L 27/3204
                                                      313/504

FOREIGN PATENT DOCUMENTS

CN    1527644 A    9/2004
CN   101093878 A   12/2007
(Continued)

*Primary Examiner* — Cheung Lee
(74) *Attorney, Agent, or Firm* — Andrew C. Cheng

(57) ABSTRACT

The disclosure provides an organic electroluminescent display device, including a substrate, an organic electroluminescent device disposed on the substrate, and a thin film packaging structure disposed on the substrate and packaging the organic electroluminescent device. The thin film packaging structure has desiccant particles. The disclosure further provides a manufacturing method of the organic electroluminescent display device, which can reduce the influence of vapor attached on surfaces of multiple layers of packaging thin films or infiltrated in the multiple layers of packaging thin films on the packaged organic electroluminescent device, so as to prolong the service life of the organic electroluminescent device.

6 Claims, 1 Drawing Sheet

(56) References Cited

FOREIGN PATENT DOCUMENTS

| | | |
|---|---|---|
| CN | 101471425 A | 7/2009 |
| CN | 102007616 A | 4/2011 |
| CN | 104637890 A | 5/2015 |
| CN | 105098091 A | 11/2015 |
| JP | 20161100963 A | 6/2016 |

* cited by examiner

ORGANIC ELECTROLUMINESCENT DISPLAY DEVICE AND MANUFACTURING METHOD THEREOF

FIELD OF THE DISCLOSURE

The disclosure relates to a display technical field, and more particularly to an organic electroluminescent display device and a manufacturing method thereof.

BACKGROUND

In recent years, an organic light-emitting diode (OLED) has been a popular burgeoning display device product domestically and internationally, because the OLED display device has properties such as self-luminescence, wide visual angles, quick response, high luminous efficiency, wide color gamut, low working voltages, thin thickness, availability in large sizes with flexibility, simple processes and so on, further with potential of low costs.

Conventional packaging techniques of packaging the OLED display device at present include a packaging technique by glass of a glass base or metallic cover, a packaging technique by single or multilayered inorganic thin film, and a thin film packaging technique of alternation of organic compounds and inorganic compounds. The thin film packaging technique is specifically adaptable in some special situations that cannot be achieved by conventional encapsulation, such as packaging flexible organic light-emitting diodes and flexible organic solar cells. A main method of enhancing the thin film packaging technique in the industry is using a drying plate or improving barriers against water and oxygen of the thin film packaging layer to the greatest extent, such as multiple layers of organic/inorganic composite thin films are deposited after production of the display device is completed to prolong the path of water and oxygen spreading in the thin film. However, the technique has inherent limitations. Alternately deposited multiple layers of thin films still have pinholes, and the positions of the pinholes generally are the paths for the vapor to infiltrate, which can cause damage or failure of the device. A thin film with little pinholes is further obtained by atomic layer deposition (ALD) in the industry. The technique can resist water and oxygen, but the vapor can also penetrate to some extent.

SUMMARY

In order to solve the technical problem above, the disclosure provides an organic electroluminescent display device that can reduce vapor entering an organic electroluminescent device efficiently and a manufacturing method thereof.

The disclosure provides an organic electroluminescent display device, including a substrate, an organic electroluminescent device disposed on the substrate, and a thin film packaging structure disposed on the substrate and packaging the organic electroluminescent device. The thin film packaging structure has desiccant particles.

Optionally, the thin film packaging structure includes: N layers of inorganic thin film packaging layers and N−1 layers of organic thin film packaging layers. N≥2 and N is a positive integer. A first layer of the inorganic thin film packaging layers is disposed on the substrate, covers and packages the organic electroluminescent device. A second layer of the inorganic thin film packaging layers to an Nth layer of the inorganic thin film packaging layers are disposed on the first layer of the inorganic thin film packaging layers in sequence. Each layer of the organic thin film packaging layers is disposed between two adjacent layers of inorganic thin film packaging layers correspondingly. Each layer of the organic thin film packaging layers is distributed with the desiccant particles.

Optionally, a distribution density of the desiccant particles in each layer of the organic thin film packaging layers increases along a direction away from the organic electroluminescent device, or the distribution density of the desiccant particles in each layer of the organic thin film packaging layers is even.

Optionally, a distribution density of the desiccant particles in an ith layer of the organic thin film packaging layers is larger than the distribution density of the desiccant particles in an (i−1)th layer of the organic thin film packaging layers, 1≤i≤N−1.

Optionally, a surface of an Nth layer of the inorganic thin film packaging layers is processed by surface roughness and/or chemical modification.

The disclosure further provides a manufacturing method of an organic electroluminescent display device, including providing a substrate, forming an organic electroluminescent device on the substrate, forming a thin film packaging structure to package the organic electroluminescent device with desiccant particles on the substrate.

Optionally, a method of forming the thin film packaging structure includes forming a first layer of inorganic thin film packaging layers on the substrate to cover and package the organic electroluminescent device, and forming N−1 layers of inorganic thin film packaging layers and N−1 layers of organic thin film packaging layers on the first layer of the inorganic thin film packaging layers by a manner of alternate stack of organic thin film packaging layer/inorganic thin film packaging layer. Each layer of the organic thin film packaging layers is distributed with the desiccant particles. N≥2 and N is a positive integer.

Optionally, during forming each layer of the organic thin film packaging layers, a distribution density of the desiccant particles in each layer of the organic thin film packaging layers is increased along a direction away from the organic electroluminescent device, or the distribution density of the desiccant particles in each layer of the organic thin film packaging layers is even.

Optionally, a distribution density of the desiccant particles in an ith layer of the organic thin film packaging layers is made to be larger than the distribution density of the desiccant particles in an (i−1)th layer of the organic thin film packaging layers, 1≤i≤N−1.

Optionally, the manufacturing method further includes processing a surface of an Nth layer of the inorganic thin film packaging layers by surface roughness and/or chemical modification.

The organic electroluminescent display device of the disclosure and the manufacturing method thereof can reduce the influence of vapor attached on surfaces of multiple layers of packaging thin films or infiltrated in the multiple layers of packaging thin films on the packaged organic electroluminescent device, so as to prolong the service life of the organic electroluminescent device.

BRIEF DESCRIPTION OF THE DRAWINGS

Aspects, features and advantages of embodiments of the disclosure will be clearer by illustration with reference to accompanying drawings.

DETAILED DESCRIPTION OF PREFERRED EMBODIMENTS

Embodiments of the disclosure will be described in detail with reference to the accompanying drawings as follows. However, the disclosure can be implemented in various forms, and the disclosure should be explained beyond the concrete embodiments. On the contrary, the provided embodiments are for illustrating the principle and practical application of the disclosure, so that a person skilled in the art can understand various embodiments of the disclosure and modifications adapted to specific applications.

In the figures, thicknesses of layers and regions are exaggerated to clarify devices. An identical label represents the same device in the embodiments and figures.

It should further be known that when a layer, a film, a region or an element of a base is described to be on another element, the element can be on another element directly, or it can also exist a middle element. Optionally, when the element is described to be on another element directly, the middle element is absent.

Figure 1:
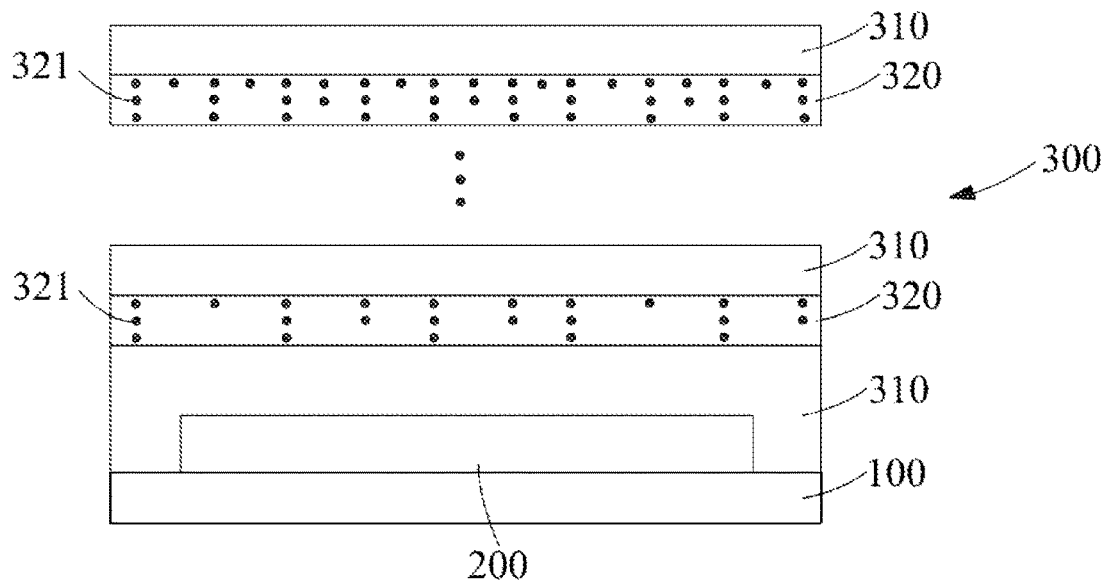
FIG. 1 is a structural schematic view of an organic electroluminescent display device according to an embodiment of the disclosure.

FIG. 1 is a structural schematic view of an organic electroluminescent display device according to an embodiment of the disclosure.

Referring to FIG. 1, the organic electroluminescent display device according to the embodiment of the disclosure includes a substrate 100, an organic electroluminescent device 200 and a thin film packaging structure 300.

Specifically, the substrate 100 can be a rigid substrate made by glass, ceramic or metal, or a flexible substrate made out of at least one of polyethylene terephthalate, polyethylene naphthalate, polyimide and so on.

The organic electroluminescent device 200 is formed on the substrate 100. As an embodiment of the disclosure, the organic electroluminescent device 200 includes a bottom electrode, a hole injection layer (HIL), a hole transport layer (HTL), an emitting layer (EML), an electron transport layer (ETL), an electron injection layer (EIL) and a top electrode overlapped in a bottom-up sequence. But the organic electroluminescent device of the disclosure is not restricted to the disclosed structure, which can also be other proper structures.

The thin film packaging structure 300 includes N layers of inorganic thin film packaging layers 310 and N-1 layers of organic thin film packaging layers 320. N≥2 and N is a positive integer. A first layer of the inorganic thin film packaging layers 310 is disposed on the substrate 100, covers and packages the organic electroluminescent device 200. The other inorganic thin film packaging layers 310 and N-1 layers of the organic thin film packaging layers 320 are formed on the first layer of the inorganic thin film packaging layers 310 by a manner of alternate stack of organic thin film packaging layer/inorganic thin film packaging layer. Moreover, the inorganic thin film packaging layers 310 can be made out of silicon oxide, silicon nitride, aluminum oxide, titanium dioxide or graphene, and the thickness thereof is 100~2000 nm. The organic thin film packaging layers 320 can be made out of acrylic, epoxy resin or silicon resin, and the thickness thereof is 20~5000 nm.

In the embodiment, in order to enhance the absorption of external vapor in the thin film packaging structure 300, the organic thin film packaging layers 320 are distributed with desiccant particles 321, and the distribution density of the desiccant particles 321 in each layer of the organic thin film packaging layers 320 is uneven. The distribution density of the desiccant particles 321 in each layer of the organic thin film packaging layers 320 increases along a direction away from the organic electroluminescent device 200. However, it should be understood that the distribution density of the desiccant particles 321 in each layer of the organic thin film packaging layers 320 can be even. The desiccant particles 321 can be actively metallic particles, actively metallic oxide particles, actively nonmetallic oxide particles (i.e. $P_2O_5$ particles) or hygroscopic salt particles whose particle size is 1~200 nm.

Furthermore, in order to further enhance the absorption of external vapor in the thin film packaging structure 300, the distribution density of the desiccant particles 321 in an ith layer of the organic thin film packaging layers 320 is larger than the distribution density of the desiccant particles 321 in an (i-1)th layer of the organic thin film packaging layers 320. 1≤i≤N-1 and i is a positive integer.

Furthermore, a surface of an Nth layer of the inorganic thin film packaging layers 310 is processed by surface roughness and/or chemical modification.

The surface roughness process is a physical or chemical method of processing the surface of materials to form surface roughness. The specific processing method can be processing the surface of materials in a dry etching cavity by plasma treatment of argon gases.

The chemical modification process is a process of substituting hydrophobic groups for some hydrophilic groups of the basal material by a method such as absorption, coating, polymerization, chemical reactions or so on to improve the hydrophobic property of the material, such as fluorination or silicification. The concentration of the superficially chemical modification (i.e. fluoride concentration after fluorination or silicon concentration after silicification) is inversely proportional to the surface tension. The specific method can be processing the surface of materials by fluorination of carbon tetrafluoride ($CF_4$) in the dry etching cavity.

Figure 2:
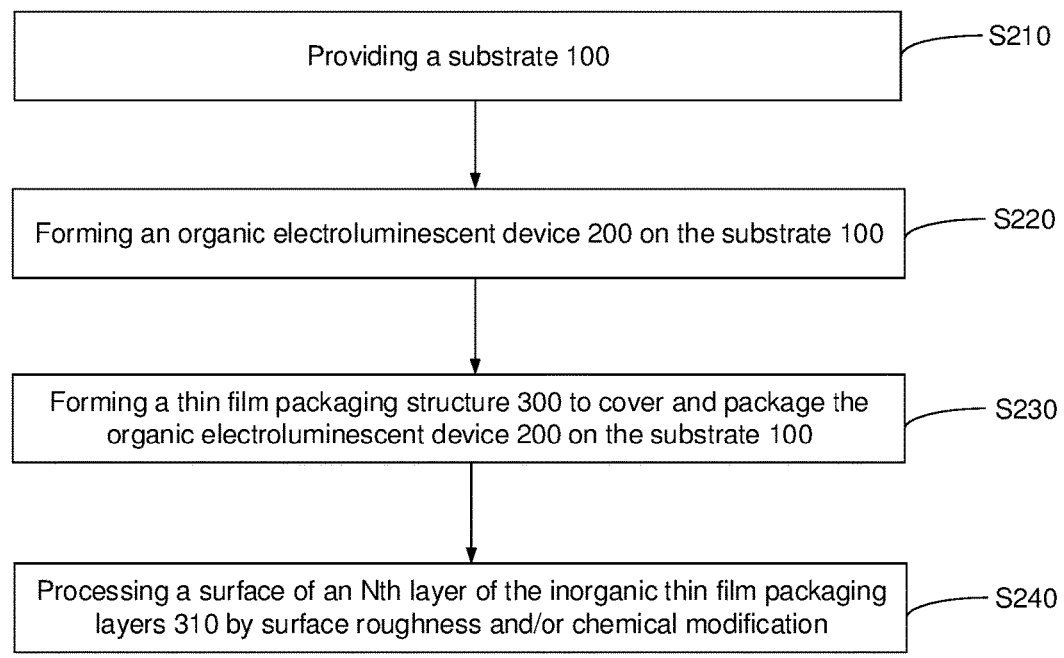
FIG. 2 is a flowchart of a manufacturing method of an organic electroluminescent display device according to an embodiment of the disclosure.

FIG. 2 is a flowchart of a manufacturing method of an organic electroluminescent display device according to an embodiment of the disclosure.

Referring to FIG. 2, along with FIG. 1, the manufacturing method of an organic electroluminescent display device according to the embodiment of the disclosure includes steps:

S210, providing the substrate 100.

S220, forming the organic electroluminescent device 200 on the substrate 100.

As an embodiment of the disclosure, the method of forming the organic electroluminescent device 200 includes forming the bottom electrode, the hole injection layer (HIL), the hole transport layer (HTL), the emitting layer (EML), the electron transport layer (ETL), the electron injection layer (EIL) and the top electrode in a bottom-up sequence. But the formation method of the organic electroluminescent device of the disclosure is not restricted to the disclosed formation method, which can also be other proper formation methods.

S230, forming the thin film packaging structure 300 to cover and package the organic electroluminescent device 200 on the substrate 100.

The method of forming the thin film packaging structure 300 includes forming a first layer of the inorganic thin film packaging layers 310 on the substrate 100 to cover and package the organic electroluminescent device 200. Specifically, the first layer of the inorganic thin film packaging layers 310 can be produced by plasma enhanced chemical vapor deposition (PECVD) or atomic layer deposition (ALD).

Subsequently, N−1 layers of the inorganic thin film packaging layers 310 and N−1 layers of the organic thin film packaging layers 320 on the first layer of the inorganic thin film packaging layers 310 by a manner of alternate stack of organic thin film packaging layer/inorganic thin film packaging layer. Each layer of the organic thin film packaging layers 320 is distributed with the desiccant particles 321. N≥2 and N is a positive integer.

Specifically, a second layer of the inorganic thin film packaging layers 310 to an Nth layer of the inorganic thin film packaging layers 310 can be produced by plasma enhanced chemical vapor deposition (PECVD) or atomic layer deposition (ALD). Moreover, each layer of the organic thin film packaging layers 320 is produced by a method such as ink-jet printing (IJP), nozzle printing or spin coating utilizing organic solution mixed with the desiccant particles 321.

In the embodiment, as the distribution density of the desiccant particles 321 in each layer of the organic thin film packaging layers 320 increases along a direction away from the organic electroluminescent device 200, in forming each layer of the organic thin film packaging layers 320, each layer of the organic thin film packaging layers 320 can be formed by adopting the organic solution mixed with different numbers of desiccant particles 321.

Furthermore, the number of the desiccant particles 321 mixed in the organic solution to form the ith layer of the organic thin film packaging layers 320 is larger than the number of the desiccant particles 321 mixed in the organic solution to form the (i−1)th layer of the organic thin film packaging layers 320.

S240, processing a surface of an Nth layer of the inorganic thin film packaging layers 310 by surface roughness and/or chemical modification. It should be illustrated that as another embodiment of the disclosure, the step S240 can be skipped.

Overall, the organic electroluminescent display device of the embodiments of the disclosure and the manufacturing method thereof can reduce the influence of vapor attached on surfaces of multiple layers of packaging thin films or infiltrated in the multiple layers of packaging thin films on the packaged organic electroluminescent device, so as to prolong the service life of the organic electroluminescent device.

Although the disclosure is illustrated with reference to specific embodiments, a person skilled in the art should understand that various modifications on forms and details can be achieved within the spirit and scope of the disclosure limited by the claims and the counterpart.

What is claimed is:

1. An organic electroluminescent display device, comprising:
    a substrate;
    an organic electroluminescent device, disposed on the substrate; and
    a thin film packaging structure, disposed on the substrate and packaging the organic electroluminescent device, the thin film packaging structure having desiccant particles,
    wherein the thin film packaging structure comprises: N layers of inorganic thin film packaging layers and N−1 layers of organic thin film packaging layers, N≥2 and N is a positive integer;
    a first layer of the inorganic thin film packaging layers is disposed on the substrate, covers and packages the organic electroluminescent device, a second layer of the inorganic thin film packaging layers to an Nth layer of the inorganic thin film packaging layers are disposed on the first layer of the inorganic thin film packaging layers in sequence; each layer of the organic thin film packaging layers is disposed between two adjacent layers of the inorganic thin film packaging layers correspondingly, each layer of the organic thin film packaging layers is distributed with the desiccant particles;
    wherein a distribution density of the desiccant particles in each layer of the organic thin film packaging layers increases along a direction away from the organic electroluminescent device, or the distribution density of the desiccant particles in each layer of the organic thin film packaging layers is even.

2. The organic electroluminescent display device according to claim 1, wherein the distribution density of the desiccant particles in an ith layer of the organic thin film packaging layers is larger than the distribution density of the desiccant particles in an (i−1)th layer of the organic thin film packaging layers, 1≤i≤N−1.

3. The organic electroluminescent display device according to claim 1, wherein a surface of an Nth layer of the inorganic thin film packaging layers is processed by surface roughness and/or chemical modification.

4. A manufacturing method of an organic electroluminescent display device, wherein the manufacturing method comprising:
    providing a substrate;
    forming an organic electroluminescent device on the substrate; and
    forming a thin film packaging structure to package the organic electroluminescent device with desiccant particles on the substrate;
    wherein a method of forming the thin film packaging structure comprises:
        forming a first layer of inorganic thin film packaging layers on the substrate to cover and package the organic electroluminescent device; and
        forming N layers of inorganic thin film packaging layers and N−1 layers of organic thin film packaging layers on the first layer of the inorganic thin film packaging layers by a manner of alternate stack of organic thin film packaging layer/inorganic thin film packaging layer; each layer of the organic thin film packaging layers is distributed with the desiccant particles, N≥2 and N is a positive integer;
    wherein during forming each layer of the organic thin film packaging layers, a distribution density of the desiccant particles in each layer of the organic thin film packaging layers is increased along a direction away from the organic electroluminescent device, or the distribution density of the desiccant particles in each layer of the organic thin film packaging layers is even.

5. The manufacturing method according to claim 4, wherein the distribution density of the desiccant particles in an ith layer of the organic thin film packaging layers is made to be larger than the distribution density of the desiccant particles in an (i−1)th layer of the organic thin film packaging layers, 1≤i≤N−1.

6. The manufacturing method according to claim 4, wherein the manufacturing method further comprises processing a surface of an Nth layer of the inorganic thin film packaging layers by surface roughness and/or chemical modification.

* * * * *